United States Patent [19]

Luhman et al.

[11] 4,426,550

[45] Jan. 17, 1984

[54] MULTIWIRE CONDUCTOR HAVING GREATLY INCREASED INTERWIRE RESISTANCE AND METHOD FOR MAKING SAME

[75] Inventors: Thomas Luhman, Seattle, Wash.; Masaki Suenaga, Bellport, N.Y.

[73] Assignee: The United States of America as represented by the United States Department of Energy, Washington, D.C.

[21] Appl. No.: 358,085

[22] Filed: Mar. 15, 1982

[51] Int. Cl.³ .................. H01B 7/08; H01B 12/00
[52] U.S. Cl. ............................ 174/128 R; 29/599; 29/825; 156/50; 156/155; 174/126 S; 174/128 S; 228/200; 335/216; 423/613; 423/614
[58] Field of Search .............. 174/15 S, 126 S, 128 S, 174/129 S; 335/216; 228/200; 428/900; 156/50, 155; 29/599, 825

[56] References Cited

U.S. PATENT DOCUMENTS

| | | | |
|---|---|---|---|
| 3,184,303 | 5/1965 | Grobin, Jr. | 29/599 |
| 3,472,944 | 10/1969 | Morton et al. | 174/126 S |
| 3,548,078 | 12/1970 | Albrecht | 335/216 X |
| 3,638,154 | 1/1972 | Sampson | 174/126 S X |
| 3,954,572 | 5/1976 | Ziegler | 29/599 X |
| 4,079,187 | 3/1978 | Fillunger | 174/126 S |
| 4,161,062 | 7/1979 | Agatsuma et al. | 29/599 |

FOREIGN PATENT DOCUMENTS 2626384 12/1977 Fed. Rep. of Germany ... 174/128 S

OTHER PUBLICATIONS

Accelerator Superconducting Magnets Give Headaches; Physics Today; Apr. 1981, pp. 17-20.
A Productive Colloration; Brookhaven Bulletin; vol. 35, No. 12; Mar. 27, 1981.

Primary Examiner—A. T. Grimley
Assistant Examiner—Morris H. Nimmo
Attorney, Agent, or Firm—Robert H. Whisker; Paul A. Gottlieb; Richard G. Besha

[57] ABSTRACT

An improved multiwire conductor of the type which is mechanically stabilized by a tin based solder filler. A solder filled conductor is heated to a temperature above its melting point for a period long enough to allow a substantial amount of copper to be dissolved from the wires comprising the conductor. The copper forms the brittle intermetallic compound $Cu_5Sn_6$ with tin in the solder. After cooling the conductor is flexed causing a random cracking of the solder, and thereby increasing the interwire resistance of the conductor. The subject invention is particularly adapted for use with braided, ribbon-type solder filled superconductors.

10 Claims, 4 Drawing Figures

12 (typ)

MULTIWIRE CONDUCTOR HAVING GREATLY INCREASED INTERWIRE RESISTANCE AND METHOD FOR MAKING SAME

BACKGROUND OF THE INVENTION

The U.S. Government has rights in this invention pursuant to Contract No. DE-AC02-76CH00016, between the U.S. Department of Energy and Associated Universities, Inc.

This invention relates to multiwire conductors, and more particularly to a braided ribbon-type superconductor having low eddy current losses, and to a method for manufacturing such superconductor.

In superconducting magnets of the type used in high energy particle accelerators the use of high aspect ratio, solder filled, braided superconductor has been proposed. (See Physics Today, April 1981, pg. 17). Superconducting wires were braided to form a ribbon-type conductor, substantially as described in U.S. Pat. No. 3,638,154 to Sampson, et al., issued Jan. 25, 1972. The interstices of the braid were then filled with a solder, typically a nominal 97 weight % Sn, 3 weight % Ag solder, in order to provide stiffness and mechanical stability to the ribbon.

While the solder provided mechanical stability, it also provided a path for eddy currents which sometimes caused unacceptable losses in magnets made with such braided superconductor. This problem was particularly difficult to deal with, since eddy current losses varied from magnet to magnet and at that time the reasons for these variations were unknown.

Examination of samples of superconductors used in prototype magnets disclosed cracks in the solder and this led to the hypothesis that low eddy current losses were related to the formation of cracks in the solder. Based on this hypothesis, efforts were made to develop methods for producing controlled cracking of the solder. As a result of these efforts, two separate methods were developed. One method, conceived by T. Luhman and C. Klamut, is the subject of a separate, currently pending, commonly assigned application, Ser. No. 358,083 filed Mar. 15, 1982 and has as its object the production of a ribbon-type superconductor having a moderately increased interwire resistance so as to reduce eddy current losses in the superconductor while retaining substantial mechanical stability.

The second method, which is the subject of the present application, has as its object, to provide a method for producing a braided, ribbon-type superconductor which has a greatly increased interwire resistance.

SUMMARY OF THE INVENTION

The above described objects are achieved and the disadvantages of the prior art are overcome by heating a multiwire conductor of the type which is mechanically stabilized by a tin based solder filler to a temperature above the melting point of the solder in a salt bath for a time sufficient to dissolve enough copper from the wires comprising the superconductor to convert a substantial portion of the tin in the solder to the brittle intermetallic compound $Cu_5Sn_6$. The superconductor is then cooled to room temperature and mechanically flexed to produce a random network of cracks in the solder. The interwire resistance can be controlled by controlling the amount of solder converted to $Cu_5Sn_6$ and the severity and extent of the flexing.

Superconductor produced in accordance with the subject invention has advantageously been found to show improvements of from two to three orders of magnitude in interwire resistance.

Other objects and advantages of the subject invention will be apparent to those skilled in the art from a consideration of the attached drawings and the detailed description set forth below.

DETAILED DESCRIPTION OF THE INVENTION

Figure 1:
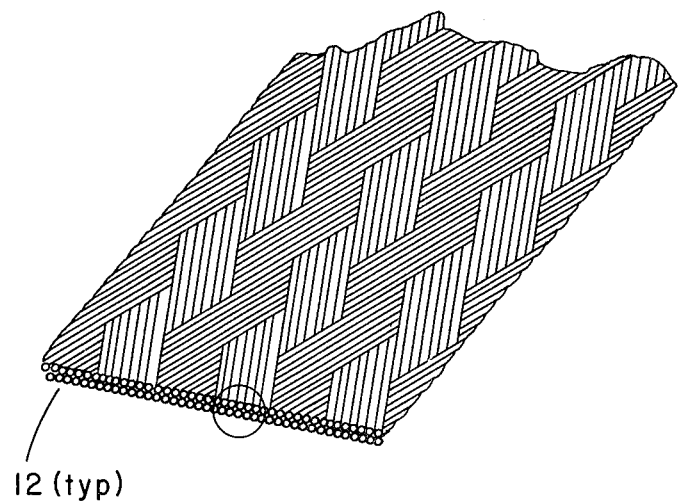
FIG. 1 is an isometric view of a segment of a braided ribbon-type superconductor of the type used in the subject invention.
Figure 2:
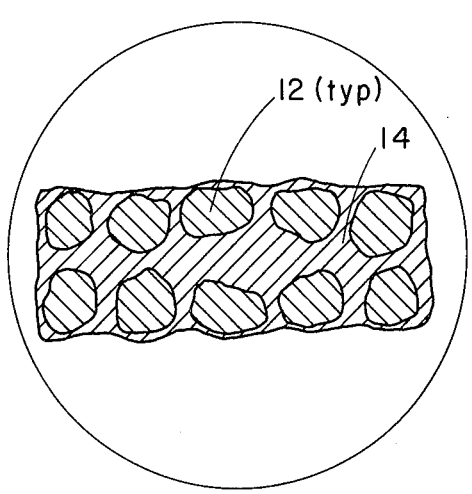
FIG. 2 is a partial cross-section of such a superconductor manufactured in accordance with the prior art.

Turning to FIGS. 1 and 2, a braided, ribbon-type superconductor is formed by braiding superconducting wires 12 by conventional means. These wires 12 are typically multifilimentary wires formed by coextrusion and drawing of a niobium-titanium and copper composite. A more detailed understanding of the manufacture and properties of superconducting wires is not believed necessary for an understanding of the subject invention.

For mechanical stability the superconductor is then filled with solder 14 by immersion in a solder bath. Solder 14 is preferably a 97 weight % Sn, 3 weight % Ag (nominal) alloy.

As may be seen in FIG. 2, solder 14 is typically in intimate contact with wire 12, though some uncontrolled cracking and separation of the solder may be caused by processing of the superconductor after it is removed from the solder bath. Because of this intimate contact between wires 12 and solder 14, eddy currents are easily induced in the solder by changes in the current in wires 12 leading to unacceptably high ac losses in the superconductor.

These loses may be reduced or eliminated in accordance with the subject invention by using the solubility of copper in molten tin or tin based solders to convert a substantial portion of the tin to the brittle intermetallic compound $Cu_5Sn_6$.

Figure 3:
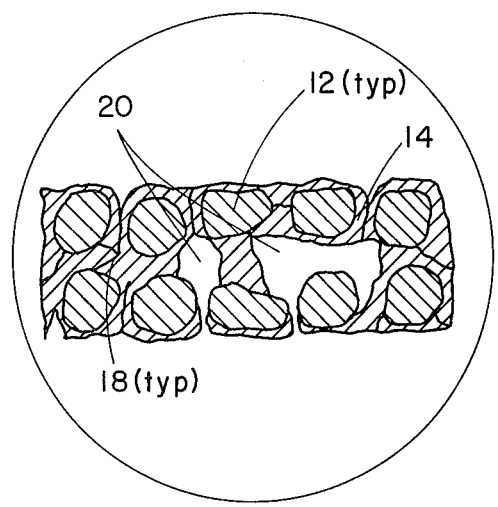
FIG. 3 is a partial cross-section of such a superconductor manufactured in accordance with the subject invention.

In accordance with the subject invention the solder filled superconductor is immersed in a salt bath and heated to a temperature above the melting point of the solder. For a typical 97 weight % Sn 3 weight % Ag this temperature is from 240° C. to 280°. The superconductor is held in the salt bath for a period of approximately from 1 to 3 minutes to allow copper to dissolve from the wires and the $Cu_5Sn_6$ compound to form. It is then removed from the salt bath and allowed to cool to room temperature. It is then flexed or otherwise mechanically worked to cause random cracking 18, as is shown in FIG. 3, of the solder. It should be noted that because of the random cracking 18 some solder will be lost forming voids 20 with a resultant decrease in the stiffness of the superconductor.

Preferably, the flexing may be carried out by passing superconductor through one or more "crown" rollers. ("Crown" rollers are well known to those skilled in the art of cable manufacture and need not be described further for an understanding of the present invention.) The amount of solder lost will depend on the particular structure of the superconductor braid and the type of solder 14 used and may be controlled by the temperature chosen and the time superconductor remains in the salt bath. Precise relationships between time and temperature and the amount of solder 14 lost may best be determined by routine experimentation.

EXPERIMENTAL EXAMPLES

Four series of short samples of superconducting braid were heat treated in a salt bath for periods ranging about from $\frac{1}{2}$ to $3\frac{1}{2}$ minutes. One series (Curve I) was processed at a temperature of 250° C. and passed through a single crown roller after cooling. The second series (Curve II) was processed similarly at 270° C. The third and fourth series (Curves III and IV) were similarly processed at 250° and 275° C. respectively, and then passed through a double crown roller.

Figure 4:
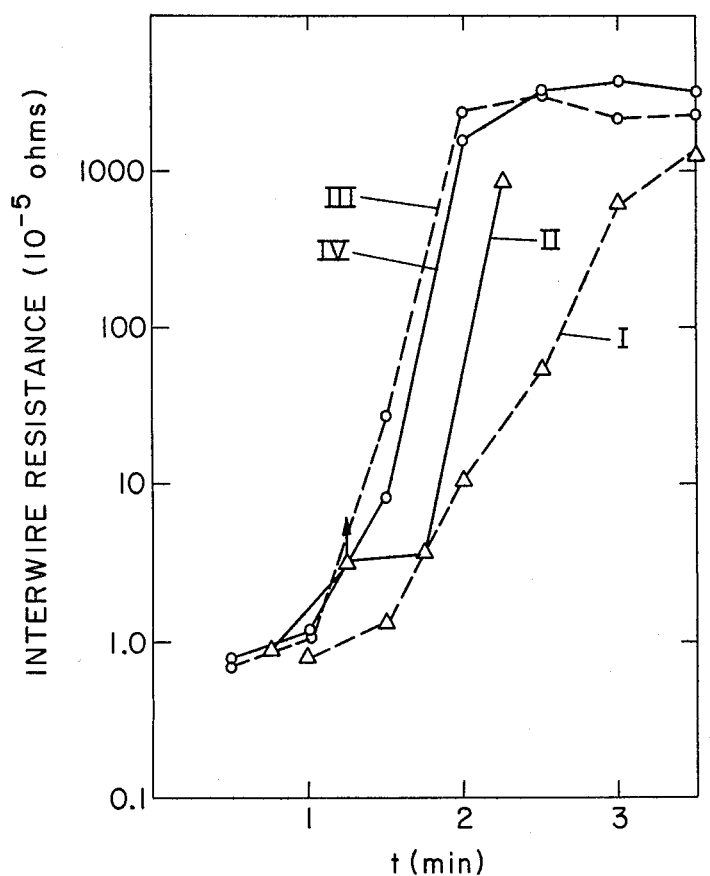
FIG. 4 is a plot of inter-wire resistance versus processing time for a number of samples produced in accordance with the subject invention.

The results obtained are shown in FIG. 4. For comparison it should be noted that the interwire resistance of untreated wire is of the order of $0.5 \times 10^{-5}$ ohms when measured under the same conditions.

The above examples and drawings and description are set forth by way of illustration only, and other embodiments of the subject invention will be readily apparent to those skilled in the art. In particular, it should be noted that it is within the contemplation of the subject invention to apply the method of the subject invention to configurations of conductors other than braided superconductors where those configurations are made mechanically stable by a solder filler, and it is desired to substantially increase the inter-wire resistance. Thus, limitations on the subject invention are to be found only in the claims set forth below.

We claim:

1. A method for increasing the interwire resistance of a multi-wire conductor containing substantial copper of the type which is mechanically stabilized by a tin based solder filler, comprising the steps of:
   (a) heating said conductor to a uniform temperature above the melting point of the solder;
   (b) maintaining said temperature for a time sufficient for a substantial amount of copper to dissolve into the solder forming the brittle intermetallic compound $Cu_5Sn_6$;
   (c) cooling the conductor to room temperature; and
   (d) flexing the conductor so that a random network of cracks forms in the solder.

2. The method of claim 1, wherein said temperature is in the approximate range of from 240° C. to 280° C. and is maintained for approximately 1 to 3 minutes.

3. The method of claims 1 or 2, wherein said heating is carried out in a salt bath.

4. The method of claims 1 or 2, wherein said conductor is a braided ribbon-type conductor.

5. The method of claim 4, wherein said conductor is a superconductor.

6. A multiwire conductor containing substantial copper mechanically stabilized by a tin based solder filler, said multiwire conductor being produced by:
   (a) heating said conductor to a uniform temperature above the melting point of the solder;
   (b) maintaining said temperature for a time sufficient for a substantial amount of copper to dissolve into the solder forming the brittle intermetallic compound $Cu_5Sn_6$;
   (c) cooling the conductor to room temperature; and
   (d) flexing the conductor so that a random network of cracks forms in the solder, said random network of cracks increasing the interwire resistance of the conductor.

7. The multi-wire conductor of claim 6, wherein the temperature to which said conductor is heated is in the approximate range of from 240° C. to 280° C., and is maintained for approximately one to three minutes.

8. The multi-wire conductor of claim 7, wherein said heating is carried out in a salt bath.

9. The multi-wire conductor of claim 6, wherein said conductor is a braided, ribbon-type conductor.

10. The multi-wire conductor of claim 6 wherein said conductor is a superconductor.

* * * * *